United States Patent [19]

Huffman

[11] Patent Number: 4,785,419

[45] Date of Patent: Nov. 15, 1988

[54] LOGARITHMIC AMPLIFIER CALIBRATOR

[75] Inventor: Douglas K. Huffman, Aloha, Oreg.

[73] Assignee: Tektronix, Inc., Beaverton, Oreg.

[21] Appl. No.: 121,187

[22] Filed: Nov. 16, 1987

[51] Int. Cl.[4] .......................... G01C 25/00; G06F 15/46
[52] U.S. Cl. .................................. 364/571.01; 330/2; 364/573
[58] Field of Search ................ 364/571, 573; 342/420; 330/2

[56] References Cited

U.S. PATENT DOCUMENTS

| | | | |
|---|---|---|---|
| 4,145,741 | 3/1979 | Nappin | 364/571 |
| 4,253,155 | 2/1981 | Freiday et al. | 364/571 |
| 4,270,177 | 5/1981 | Endoh et al. | 364/571 |
| 4,328,552 | 5/1982 | Stovall | 364/571 |
| 4,335,384 | 6/1982 | Roos | 330/2 |
| 4,510,454 | 4/1985 | Sherman | 330/2 |
| 4,622,843 | 11/1986 | Hormel | 364/571 |

Primary Examiner—Parshotam S. Lall
Assistant Examiner—Kevin J. Teska
Attorney, Agent, or Firm—Francis I. Gray; Boulden G. Griffith

[57] ABSTRACT

A logarithmic amplifier calibrator internal to an electronic instrument applies a swept frequency signal via a switch and a single pole resonator to a logarithmic amplifier to be calibrated. The logarithmic amplifier output is digitized and stored as a frequency response for the resonator. The switch is opened and the single pole resonator rings down through the logarithmic amplifier. The ringdown output of the logarithmic amplifier also is digitized and stored as a linear log response. A ripple error look-up table is generated from the linear log response. An approximate bandwidth for the resonator is determined from the frequency response and a ringdown time corresponding to the time the linear log response decreases from the maximum amplitude to a 3 dB down amplitude of the frequency response to determine the exact bandwidth for the resonator. The log rate/gain is determined from the exact bandwidth to produce a gain correction value which may be applied as a gain control signal to the logarithmic amplifier.

6 Claims, 2 Drawing Sheets

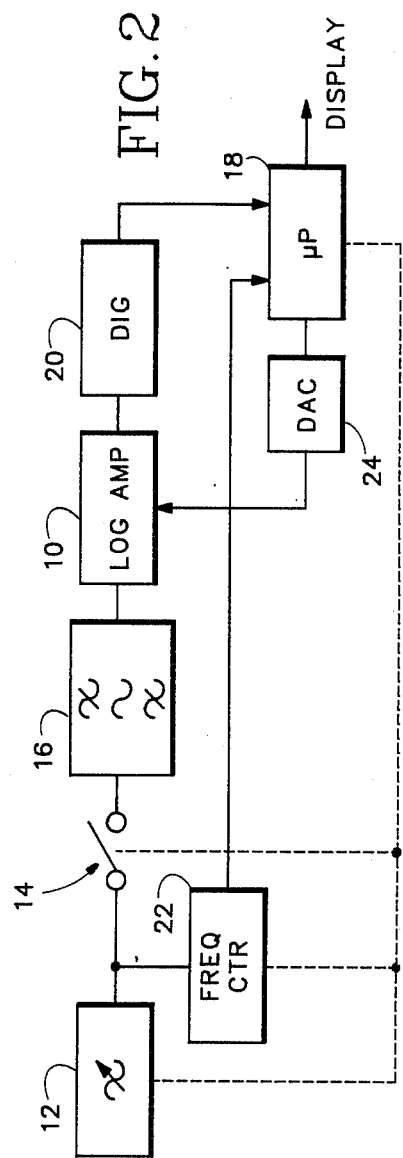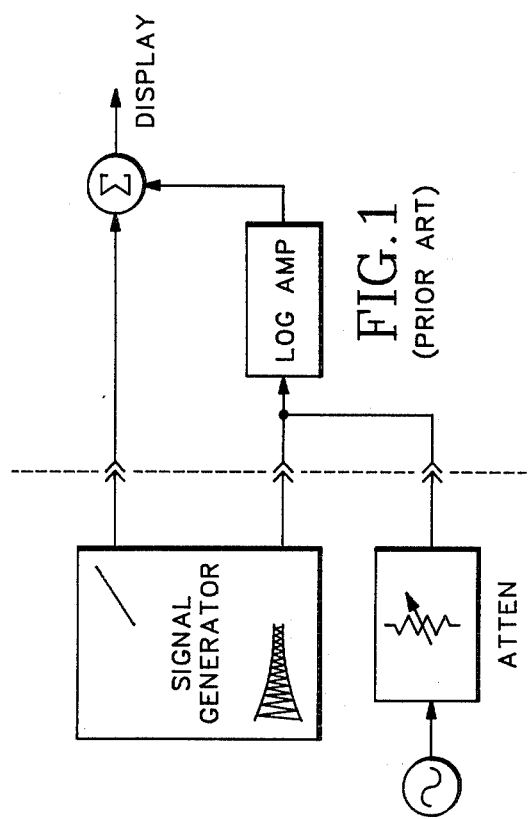

LOGARITHMIC AMPLIFIER CALIBRATOR

BACKGROUND OF THE INVENTION

The present invention relates to calibration systems, and more particularly to a logarithmic amplifier calibrator which provides a more accurate logarithmic display for an electronic instrument requiring a precise logarithmic amplifier without using any internal or external standard in the form of a precision attenuator or precision gain step.

Precision instruments which use logarithmic amplifiers require a precise calibration of the logarithmic amplifiers to provide the greatest measurement accuracy. Generally this requires precise test instruments in a laboratory environment, i.e., precision signal generators and step attenuators. As shown in FIG. 1 a test signal having an exponential envelope is input to the logarithmic amplifier of a precision instrument to be calibrated and the output is observed. The output for an ideal logarithmic amplifier is a ramp output having a smooth slope. However in actuality there is some ripple which appears on the slope. The logarithmic amplifier output is compared with an inverse ramp signal from the signal generator by adding the output with the inverse ramp to produce a constant d.c. output component. The logarithmic amplifier is then adjusted until the ringing is minimized. Then the exponential signal is removed and a known precision amplitude signal is input via a precision attenuator. The logarithmic amplifier is now adjusted to provide the desired gain characteristics. This calibration procedure is labor intensive and can only be done at a test bench having the necessary test equipment.

What is desired is a method for precisely calibrating logarithmic amplifiers in an electronic instrument in the field without the requirement for external test equipment.

SUMMARY OF THE INVENTION

Accordingly the present invention provides a logarithmic amplifier calibrator which is self contained within an electronic instrument. A swept frequency signal is applied to a single pole resonator. The output of the resonator is input to the logarithmic amplifier to be calibrated. The output of the logarithmic amplifier is digitized and input to a microprocessor. This data represents the frequency response of the resonator. At the approximate 3 dB down points the frequency is counted and the frequency difference F is recorded together with the maximum amplitude and the amplitude at the approximate 3 dB down point. Then the resonator is charged with energy and a ringdown is performed. The output of the logarithmic amplifier is again digitized and stored in the microprocessor. The ringdown amplitudes are compared with the maximum and 3 dB amplitudes, and the time T to ringdown between the two amplitudes is recorded. From F and T the exact 3.01 dB bandwidth BW of the resonator is determined, and from the bandwidth the logarithmic response of the logarithmic amplifier is very precisely calibrated. The ripple errors are stored in a look-up table in the microprocessor. The gain errors may be converted into an analog signal to adjust the gain of the logarithmic amplifier.

The objects, advantages and other novel features of the present invention are apparent from the following detailed description when read in conjunction with the appended claims and attached drawing.

BRIEF DESCRIPTION OF THE DRAWING

FIG. 1 is a block diagram of a prior art logarithmic amplifier calibration system.

FIG. 2 is a block diagram of a logarithmic amplifier calibrator according to the present invention.

DESCRIPTION OF THE PREFERRED EMBODIMENT

Figure 3:
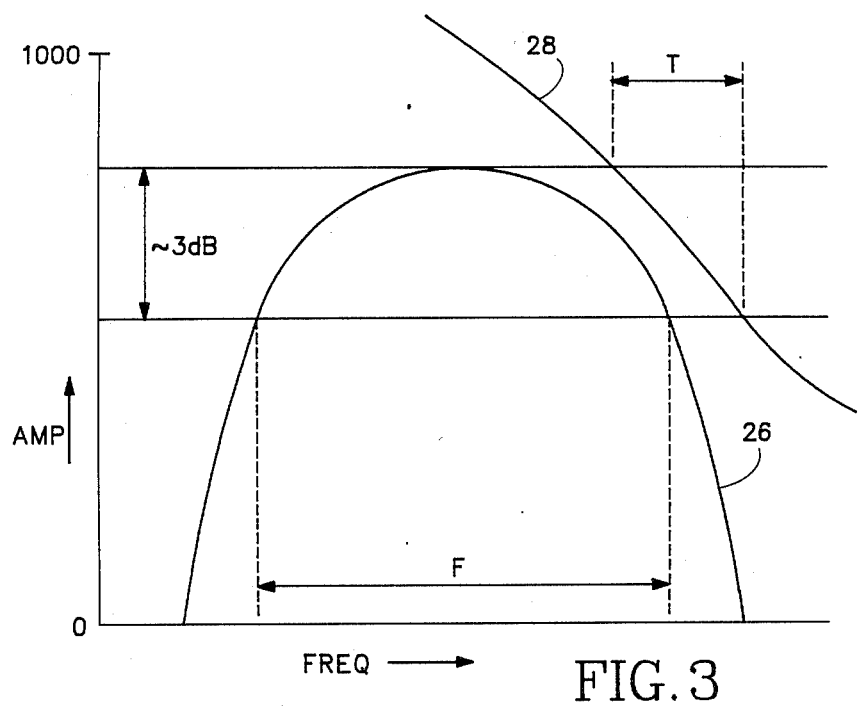
FIG. 3 is a graphic diagram of the output of a logarithmic amplifier being calibrated to illustrate the operation of the logarithmic amplifier calibrator according to the present invention.

Referring now to FIG. 2 a logarithmic amplifier 10 to be calibrated in an electronic instrument has a sweep frequency generator 12 coupled to the input via a switch 14 and a single pole resonator 16 acting as a bandwidth filter. The exact characteristics of the logarithmic amplifier 10 and the resonator 16 are unknown. The output of the logaritnmic amplifier 10 is coupled to a microprocessor 18 via a digitizer 20. A frequency counter 22 is connected to the output of the swept frequency generator 12 to precisely determine the frequency of the generator output signal for input to the microprocessor 18. The microprocessor 18 performs necessary calculations and controls the operation of the sweep frequency generator 12, the frequency counter 22 and the switch 14. The microprocessor 18 via a digital to analog converter (DAC) 24 provides a gain control signal to the logarithmic amplifier 10 to correct for gain error.

Figure 4:
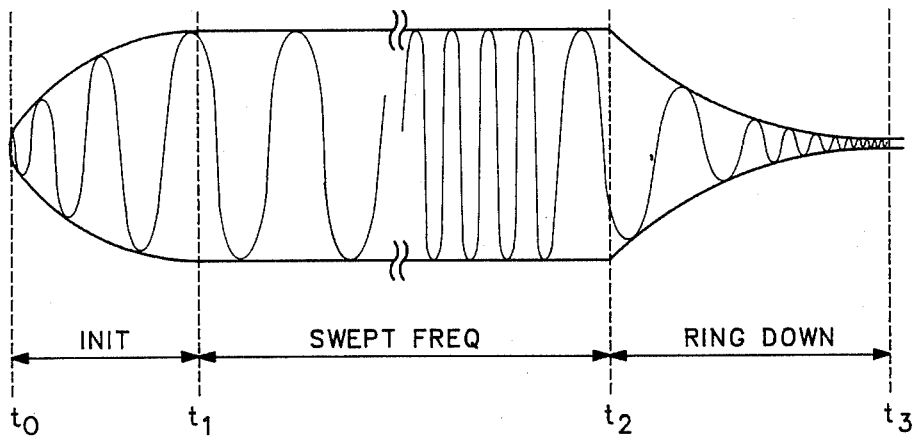
FIG. 4 is a graphic diagram of the signal applied to the logarithmic amplifier calibrator to illustrate the operation according to the present invention.

Referring to FIGS. 2 and 4, when the calibration sequence is started at time $T_o$ with the closure of the switch 14, the resonator 16 charges up until it reaches a steady state at time $T_1$. At time $T_1$ the output of the swept frequency generator is swept through a frequency range which encompasses the frequency range of the resonator 16. The output of the logarithmic amplifer 10 is the frequency response curve 26 shown in FIG. 3. The frequency response curve of the resonator 16 is digitized and stored in the microprocessor 18 together with the corresponding frequency values from the frequency counter 22. Based upon the recorded frequency response the microprocessor 18 computes an approximate bandwidth F and records the maximum amplitude and the amplitude at an approximate 3 dB down point.

Then the microprocessor 18 charges the resonator 16 with a higher amplitude test signal at the resonant frequency as determined by the frequency response and, referring again to FIG. 4, at time $T_2$ opens the switch 14 to allow the resonator to ring down. Since the resonator 16 is a single pole bandpass filter, it provides an essentially perfect exponential decay as a calibration signal, as illustrated by the curve between $T_2$ and $t_3$ in FIG. 4. When the exponential decay from the resonator 16 is passed through the logarithmic amplifier 10, the output from the logarithmic amplifier changes in a linear fashion with time as shown by the linear curve 28 in FIG. 3. Any imperfections from a pure linear slope, representative of ripple errors, are determined by the microprocessor 18 and stored in a look-up table. The microprocessor 18 also determines the time T the logarithmic linear output takes to ring down from the maximum value to the 3 dB down value. From F and T an exact 3.01 dB down bandwidth of the resonator 16 is determined from the equation:

$$BW = 10/27.2875/T*\log(F/BW)^2 + 1$$

where T is the time in seconds for the about 3 dB ringdown, F is the frequency difference in Hz between the about 3 dB down points of the resonator (the same digitizer 20 numbers as T was measured with), and BW is the actual 3.0103 dB down frequency of the resonator in Hz.

Once the bandwidth BW of the resonator 16 is determined, the logarithmic amplifier is very precisely calibrated because the rate of logarithmic ringdown is 27.2875*BW and the result is in dB/sec. Any gain error determined is compensated by the microprocessor 18 by providing a gain correction signal via the DAC 24 to the logarithmic amplifier.

To calibrate an instrument, such as a spectrum analyzer having logarithmic amplifiers, the scale of the display is set to 1 dB/div, the gain of the logarithmic amplifier is recorded a dac1, and the appropriate resonator filter 16 is selected for the logarithmic amplifier to be calibrated. The microprocessor 18 commands the sweep frequency generator 12 to provide a swept frequency signal to the resonator 16, and the resulting amplitude from the digitizer 20 and the corresponding frequency from the frequency counter 22 are recorded as amplitude (y) and frequency (x) values, respectively. The reference level for the display is set so that the maximum amplitude from the digitizer 20 is more than three divisions in the vertical direction. i.e., more than 3 dB. The maximum amplitude is determined as (ymax, xmax). For a digitzer 20 which provides a resolution of 100 values per vertical division, the approximate bandwidth point is determined by subtracting 300 from the maximum amplitude, ybw=ymax−300. Then the approximate bandwidth F is determined by obtaining the frequency difference (deltax) between the two bandwidth points about the peak amplitude.

Next the microprocessor 18 charges the resonator 16 with a fixed frequency test signal corresponding to the frequency at the maximum amplitude, ymax, the amplitude of the fixed frequency test signal being greater than the amplitude of the swept frequency test signal to allow the settling of transients in the ringdown curve prior to the area of interest. Then the microprocessor 18 commands the switch 14 to open to obtain ringdown data from the logarithmic amplifier 10 via the digitizer 20. The time and amplitude (x,y) coordinates for the ringdown data points which correspond to the peak data point and the approximate bandwidth data point are determined. Generally the exact values for the x coordinates are determined by interpolation where the peak data print and the approximate bandwidth data point are not exactly equal to the ringdown curve sample amplitudes. From the determined x values the ringdown time T is determined. From the values of F and T the actual bandwidth of the resonator 16 is determined iteratively according to the bandwidth equation shown above.

The gain of the logarithmic amplifier 10 is determined according to the equation:

$$GAIN = slope/(dB/div) + intercept$$

since the output of the logarithmic amplifier is optimally a straight line in response to an exponential input. Therefore the ten division ringdown time is determined between ten and one thousand ten where each division is one hundred. A dB1 value is determined from the equation:

dB1 = rdtime*BW*2728.75/1000

The scale is set for 10 dB per division and the logarithmic amplifier gain is recorded as dac10. New ringdown data is obtained and the ringdown time between set amplitudes, such as 1000 and 400, is determined. A dB10 value is determined from the equation:

$$10 = rdtime*BW*2728.75/600$$

From the dB1, dB10, dac1 and dac10 values the slope and intercept are calculated from the equations:

$$slope = (dac10 - dac1)/(1/dB10 - 1/dB1)$$
$$intercept = dac1 - slope*dB1.$$

From slope and intercept the complete gain characteristic of the logarithmic amplitude is determined.

Also with the gain line defined the ripple errors, i.e., the variations from a straight line in the ringdown data, are readily determined and loaded into a lookup table to complete the calibration of the logarithmic amplifier.

All the elements, including the logarithmic amplifier 10 to be calibrated, may be included within the electronic instrument itself, such as in a spectrum analyzer, so that no external test equipment is required. The calibration may be performed automatically when the electronic instrument is first powered up and periodically thereafter, as well as when predetermined temperature variations are detected.

Thus the present invention provides a logarithmic amplifier calibrator which automatically calibrates a logarithmic amplifier using internal electronic instrument components by determining the frequency response of a resonator, and, from the approximate bandwidth of the resonator and the ringdown time of the resonator between amplitudes corresponding to the maximum and 3 dB down points, determining the accurate 3.01 dB down bandwidth from which the logarithmic amplifier is very precisely calibrated without requiring precision external test equipment.

What is claimed is:

1. A calibrator for a logarithmic amplifier comprising:

a single pole resonator having an input and an output, a test signal being applied to the input and the output being coupled to an input of the logarithmic amplifier;

means for interrupting the test signal applied to the single pole resonator input to cause the single pole resonator to ring down; and means for determining calibration parameters from an output of the logarithmic amplifier, the output including data in response to the test signal and in response to the ringdown of the single pole resonator.

2. A calibrator as recited in claim 1 wherein the determining means comprises:

means for digitizing and storing the logarithmic amplifier output; and means for calculating the calibration parameters from the digitized and stored logarithmic amplifier output.

3. A calibrator as recited in claim 1 further comprising means for controlling the test signal and the interrupting means such that the test signal has a swept frequency signal and a fixed frequency signal, the logarithmic amplifier output in response to the swept frequency signal providing a frequency response function for the single pole resonator and the logarithmic amplifier output in response to the ringdown of the single pole resonator after the fixed frequency signal is applied providing a linear logarithmic response function, the controlling means activating the interrupting means to produce the ringdown, the calibration parameters being calculated by the determining means from the frequency response function and the linear logarithmic response function.

4. A calibrator as recited in claim 3 further comprising means for generating the test signal in response to the controlling means.

5. A method for calibrating a logarithmic amplifier comprising the steps of:
applying a swept frequency signal to an input of the logarithmic amplifier through a single pole resonator;
determining from an output of the logarithmic amplifier a frequency response function for the single pole resonator in response to the swept frequency signal;
applying a fixed frequency signal to an input of the single pole resonator;
interrupting the fixed frequency signal at the input of the single pole resonator to allow the single pole resonator to ring down;
determining from the output of the logarithmic amplifier a linear logarithmic response function in response to the ringdown of the single pole resonator; and
calculating from the frequency response function and the linear logarithmic response function calibration parameters for the logarithmic amplifier.

6. A method for calibrating a logarithmic amplifier comprising the steps of:
applying a swept frequency signal via a switch and a single pole resonator to the logarithmic amplifier to produce a swept output;
digitizing and storing the swept output of the logarithmic amplifier as a frequency response for the single pole resonator;
allowing the single pole resonator to ring down through the logarithmic amplifier after the single pole resonator has been charged by a fixed frequency signal, thus producing a ringdown output;
digitzing and storing the ringdown output of the logarithmic amplifier as linear log response; and
calculating from the frequency response and the linear log response calibration parameters for the logarithmic amplifier.

* * * * *